United States Patent [19]
Templeton, Jr. et al.

[11] Patent Number: 5,766,975
[45] Date of Patent: Jun. 16, 1998

[54] PACKAGED INTEGRATED CIRCUIT HAVING THERMAL ENHANCEMENT AND REDUCED FOOTPRINT SIZE

[75] Inventors: Thomas H. Templeton, Jr., Fremont; Robin H. Hodge, Portola Valley, both of Calif.

[73] Assignee: Integrated Device Technology, Inc., Santa Clara, Calif.

[21] Appl. No.: 370,048

[22] Filed: Jan. 9, 1995

[51] Int. Cl.$^6$ .................................. H01L 21/60
[52] U.S. Cl. .................. 437/209; 437/214; 437/215; 437/217
[58] Field of Search .................. 437/209, 211, 437/214, 215, 216, 217, 218, 219, 220

[56] References Cited

U.S. PATENT DOCUMENTS

| | | | |
|---|---|---|---|
| 4,635,346 | 1/1987 | Matsuzaki | 437/209 |
| 5,182,632 | 1/1993 | Bechtel et al. | 257/713 |
| 5,200,367 | 4/1993 | Ko | 437/209 |
| 5,291,062 | 3/1994 | Higgins, III | 257/658 |
| 5,307,240 | 4/1994 | McMahon | 257/690 |
| 5,403,784 | 4/1995 | Hashemi et al. | 437/220 |
| 5,407,864 | 4/1995 | Kim | 437/209 |

*Primary Examiner*—Kevin Picardat
*Attorney, Agent, or Firm*—Skjerven, Morrill, MacPherson, Franklin & Friel

[57] ABSTRACT

According to the invention, a packaged integrated circuit includes a lid attached to a base to enclose a cavity, an integrated circuit chip or chips being attached to each of the lid and base within the cavity. Preferably, the chip or chips that generate the most heat during operation of the packaged integrated circuit are attached to the lid and the lid is made of a material having good thermal conductivity such as aluminum nitride. The chips attached to the base generate relatively little heat and so do not require a heat sink to be included in the base. The packaged integrated circuit is formed in a cavity-up configuration, thereby enabling connection pins or solder balls to be formed over the entire exterior surface of the base, increasing interconnection density. Additionally, attachment of chips to both the lid and the base allows an increased number of electronic functions to be included in one packaged integrated circuit. Further, the chip or chips attached to the lid can be tested before being committed to the base, thereby enabling defective chips to be discarded without having to discard the relatively expensive base.

14 Claims, 8 Drawing Sheets

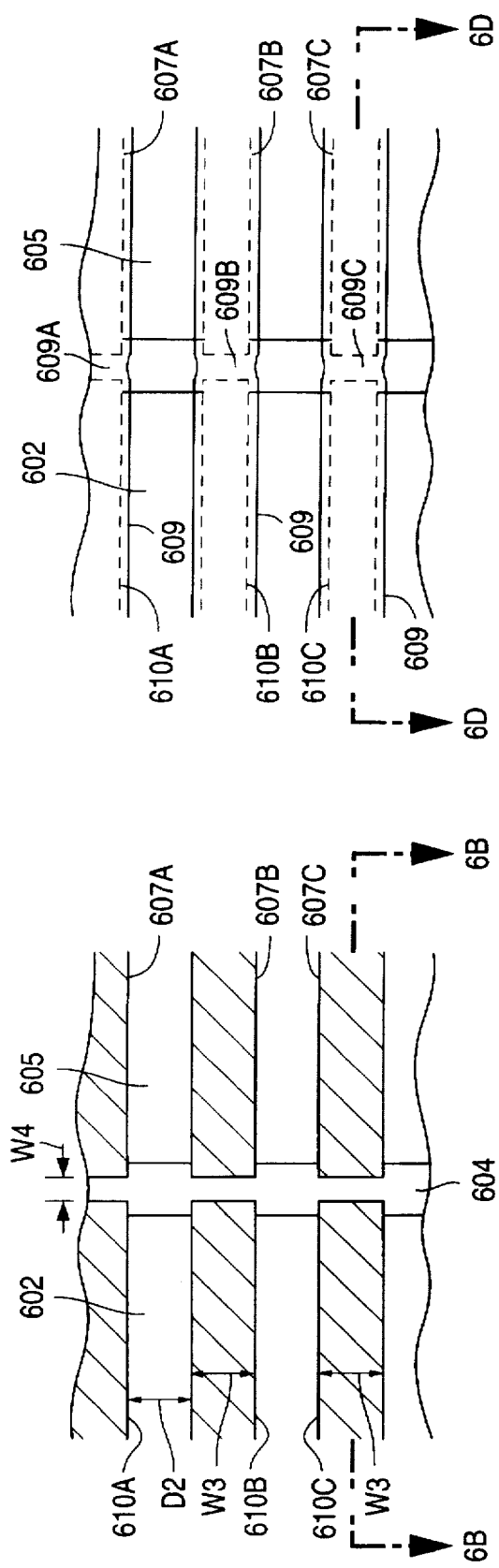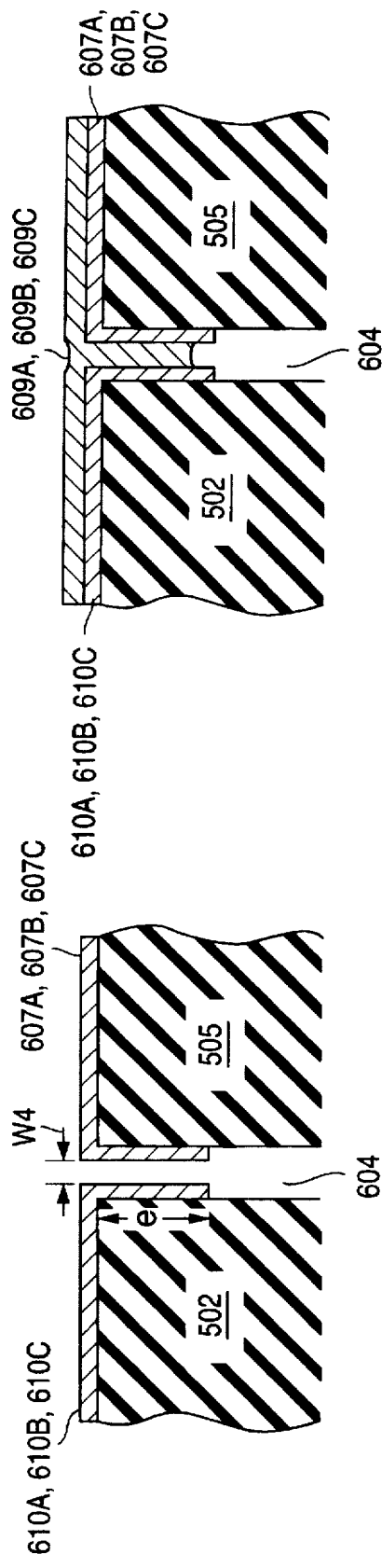

PACKAGED INTEGRATED CIRCUIT HAVING THERMAL ENHANCEMENT AND REDUCED FOOTPRINT SIZE

BACKGROUND OF THE INVENTION

1. Field of the Invention

This invention relates to integrated circuits and, in particular, to packaged integrated circuits in which a lid is attached to a base to enclose a semiconductor die.

2. Related Art

Integrated circuit chips (semiconductor dice on which electrically conductive material is formed) can be packaged in a variety of ways, e.g., encapsulated in plastic, enclosed in ceramic, or enclosed in a metal can, to form packaged integrated circuits. Packaged integrated circuits can be mounted on, for instance, a printed circuit board so that the integrated circuit chip within the package is connected to electrically conductive material outside the package. In through-hole mounting, e.g., dual-in-line packages (DIPs) and pin grid arrays (PGAs), electrically conductive pins that extend outside the package are inserted into holes formed in a mounting board, the holes being coated with electrically conductive material. In surface mounting, e.g., plastic leaded chip carriers (PLCCs) and quad flat packs (QFPs), electrically conductive leads extend outside the package and are attached to electrically conductive material formed on a surface of the mounting board.

FIG. 1A is a cross-sectional view of a prior art cavity-down ceramic pin grid array (PGA) 100. Integrated circuit chip 104 is attached to surface 102a of ceramic base 102 within a cavity formed in base 102. Heat sink 106 is formed in base 102 in proximity to chip 104 such that heat sink 106 is exposed beyond surface 102d of base 102 to the exterior of cavity-down PGA 100. Bond wires 103 are used to make electrical connection between bond pads (not shown) on chip 104 and bond pads (not shown) on surface 102c of base 102. Lid 105 is attached with adhesive 107 to surface 102b of base 102 to seal chip 104 in the cavity. Electrically conductive pins 101 extend from surface 102b of base 102. Pins 101 are electrically connected to the bond pads on surface 102c by electrically conductive vias and traces (not shown) formed in base 102. Cavity-down PGA 100 is mounted on a mounting board by positioning pins 101 in corresponding holes formed in the mounting board, the holes being coated with electrically conductive material.

FIG. 1B is a plan view along direction 1B—1B (FIG. 1A) of cavity-down PGA 100 illustrating surface 102b from which pins 101 extend. For clarity, lid 105, bond wires 103 and heat sink 106 are not shown, and only some of pins 101 are shown. As is evident from FIG. 1B, a large portion of surface 102b from which pins 101 could otherwise extend, is unavailable for that purpose. For instance, pins 101 cannot be located near inner peripheral edge 112a of surface 102b since lid 105 (FIG. 1A) must be attached to surface 102b near edge 112a. Further, a relatively large area (circumscribed by edge 112a in FIG. 1B) must be eliminated from surface 102b in order to allow space for chip 104 and the bond pads on surface 102c.

Given the above constraints, the area defined by outer peripheral edge 112b of surface 102b (the "footprint" of cavity-down PGA 100) must be made large enough so that surface 102b is large enough to accommodate the desired number of pins 101.

FIG. 2 is a cross-sectional view of a prior art cavity-up ceramic PGA 200. Cavity-up PGA 200 is similar to cavity-down PGA 100 and similar elements are designated with the same numerals in FIGS. 1A, 1B and 2. In cavity-up PGA 200, pins 101 extend from surface 102d of base 102, rather than surface 102b of base 102 as in cavity-down PGA 100. In cavity-up PGA 200, the above-noted limitations on usage of surface 102b for placement of pins 101 are not present, since pins 101 do not extend from surface 102b. However, the presence of heat sink 106 still prevents complete usage of surface 102d for pins 101 and the footprint of cavity-up PGA 200 is, like cavity-down PGA 100, undesirably large. While elimination of heat sink 106 would provide more area on surface 102d for pins 101, thereby enabling the footprint of cavity-up PGA 200 to be made smaller, the absence of heat sink 106 would prevent effective removal of heat from cavity-up PGA 200 during operation.

Additionally, in conventional PGAs (either cavity-up or cavity-down), an integrated circuit chip is attached only to a surface, e.g., surface 102a, of the package base, e.g., base 102. The package lid is generally not sufficiently robust to support an integrated circuit chip. Also, the package cavity is not large enough to accommodate a chip attached to the lid and a chip attached to the base.

In a packaged integrated circuit, each integrated circuit chip must be tested for proper functionality after being attached and electrically connected to the package leads. In conventional PGAs, a chip or chips are attached and electrically connected to a package base which also includes a heat sink and the package pins (e.g., FIGS. 1A and 1B). Thus, the chip or chips are tested only after being committed to the relatively expensive package base. If the chip or chips do not perform satisfactorily, the package base must be discarded along with the defective chip or chips.

SUMMARY OF THE INVENTION

According to the invention, a packaged integrated circuit includes a lid attached to a base to enclose a cavity, an integrated circuit chip or chips being attached to each of the lid and base, within the cavity. The chips are electrically connected by a structure for making connection to electronic devices external to the packaged integrated circuit. The structure for making connection includes, for example, pins or solder balls formed on an exterior surface of the base, and leads extending from the packaged integrated circuit.

Preferably, the chip or chips that generate the most heat during operation of the packaged integrated circuit are attached to the lid and the lid is made of a material having good thermal conductivity such as aluminum nitride. The chip or chips attached to the base generate relatively little heat and so do not require a heat sink to be included in the base. The packaged integrated circuit is formed in a cavity-up configuration, thereby enabling connection pins or solder balls to be formed over the entire exterior surface of the base, increasing interconnection density. Additionally, attachment of chips to both the lid and the base allows an increased number of electronic functions to be included in one packaged integrated circuit. Further, the chip or chips attached to the lid can be tested before the lid is attached to the base, thereby enabling defective chips to be discarded without having to discard the relatively expensive base.

The chips can be electrically connected to electrically conductive material formed on the base and lid in any desired manner such as wirebonding or flip chip connection. Electrically conductive vias and/or traces are formed in the lid and the base. In one embodiment, the vias and/or traces make electrical connection between the chip or chips attached to the lid and the chip or chips attached to the base.

In an alternative embodiment, the vias and/or traces make electrical connection between the chip or chips attached to the lid and the structure for making connection to external electronic devices.

The base can be formed with a shelf within the cavity, so that a substrate on which one or more integrated circuit chips are attached can be attached to the shelf. The chips on the substrate are preferably tested before being committed to the packaged integrated circuit. Preferably, the chips that generate the least heat are attached to the substrate.

One or more vias can be formed that extend between a chip or chips attached to the base and a land or lands on which a connection pin or a solder ball are formed. The via or vias are coated with a material having greater thermal conductivity than the base material, thereby enabling heat to be effectively transferred from the chip or chips through the via or vias to the land or lands.

As part of the electrical connection between the chip or chips attached to the lid and the remainder of the packaged integrated circuit, a plurality of traces are formed on an exterior surface of the lid and extend to an edge of the lid. Traces are formed on the adjacent upper base surface and extend to an edge of the base surface such that corresponding traces on the lid and base are aligned with each other. When the lid is attached to the base, a gap exists between the exterior surface of the lid and the upper base surface. An electrically conductive bridge is formed to connect each one of the electrically conductive traces at the lid exterior surface to the corresponding trace on the base upper surface. In one embodiment, each of the bridges is formed by immersing the base upper surface and the lid exterior surface in a solder bath.

The gap between the lid and the base has a width. Each pair of adjacent traces on either the lid or the base is separated by a distance. According to the invention, the distance has a magnitude relative to the width such that the solder forms an electrically conductive bridge between traces on the lid and corresponding traces on a base, but not does not short a pair of adjacent traces on either the base or the lid. In an additional embodiment, each of the traces on the base upper surface and the lid exterior surface extends into the gap along a wall of the gap, thereby allowing the distance between adjacent traces to be reduced without increasing the possibility of electrical shorting of adjacent traces. In another embodiment, electrical bridges are formed between the base traces and the lid traces using screen printed solder or epoxy. Other methods of forming such electrical bridges can also be used.

BRIEF DESCRIPTION OF THE DRAWINGS

FIG. 6A is a plan view of a portion of a base and a lid for use in packaging one or more semiconductor die, illustrating the interface between the base and the lid according to another embodiment of the invention. FIG. 6B is a cross-sectional view taken along section 6B—6B of FIG. 6A.

FIG. 6C is a plan view of the portion of the base and lid of FIG. 6A illustrating the formation of electrically conductive bridges between electrically conductive traces formed in or on the lid and electrically conductive traces formed in or on the base according to the embodiment of the invention of FIGS. 6A and 6B. FIG. 6D is a cross-sectional view taken along section 6D—6D of FIG. 6C.

DETAILED DESCRIPTION OF EMBODIMENTS OF THE INVENTION

A package lid in accordance with this invention, sometimes referred to as a lid, is sufficiently robust to carry the weight of an integrated circuit chip, sometimes referred to as a chip. Furthermore, a cavity formed when a package lid is attached to a base is sufficiently large to accommodate at least one chip attached to the lid and at least one chip attached to the base. Therefore a chip or chips are attached to the package lid and an additional chip or chips are attached to the base to enable more than one chip to be enclosed within the integrated circuit package, thereby increasing the number of electrical functions that can be performed by the integrated circuits within the package. Attaching an integrated circuit chip or chips to a portion of the package less expensive than the base, such as the package lid, minimizes the cost of discarding a defective chip or chips.

Figure 3A:
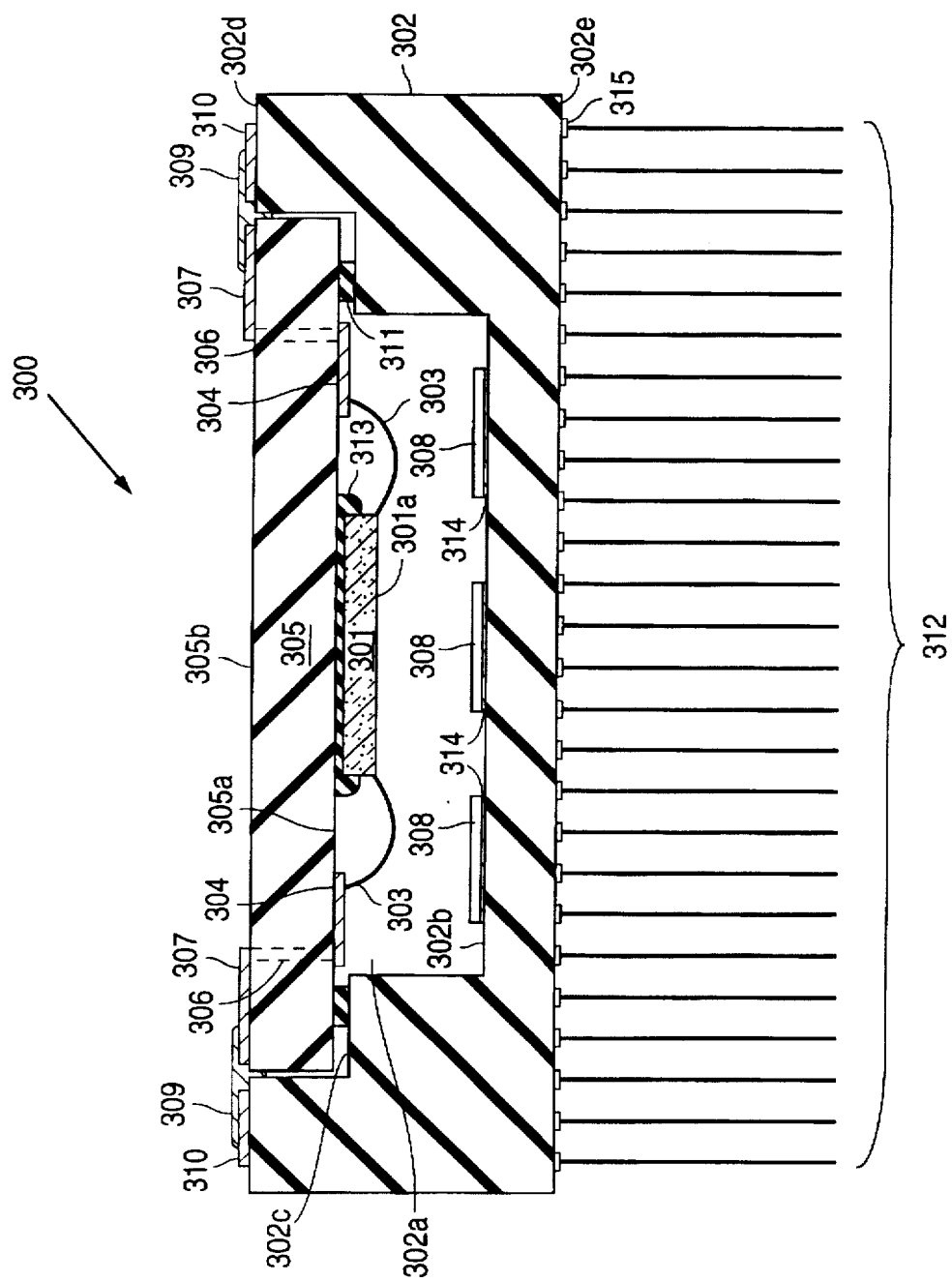
FIG. 3A is a cross-sectional view of a pin grid array according to an embodiment of the invention.

FIG. 3A is a cross-sectional view of pin grid array (PGA) 300 according to the invention. Lid 305 is attached to base 302 with adhesive 311 to enclose cavity 302a formed in base 302. Integrated circuit chip 301 is attached with adhesive 313 to die attach surface 305a of lid 305. Surface 305a faces into cavity 302a. A plurality of integrated circuit chips 308 are attached with adhesive 314 to cavity bottom surface 302b of base 302.

Electrically conductive circuitry (not shown) and a plurality of electrically conductive bond pads (not shown) are formed on surface 301a of chip 301. Using conventional wirebonding techniques and equipment, each of a plurality of bond wires 303 are connected between one of the bond pads on chip 301 and one of a plurality of electrically conductive traces 304 formed on die attach surface 305a of lid 305. One of a plurality of electrically conductive vias 306 connects each trace 304 to one of a plurality of electrically conductive traces 307 formed on exterior surface 305b of lid 305. Traces 304, traces 307 and vias 306 are formed of conventional conductive material such as tungsten, nickel and gold using conventional techniques and equipment.

Lid 305 is made sufficiently rigid to support a silicon chip without flexing. In addition, lid 305 may be hermetically sealable to base 302, thermally compatible with base 302, and stiff enough to avoid destructive vibrations. Lid 305 may be made of an electrically non-conductive material having good thermal conductivity such as, for example, aluminum nitride. Alternatively, lid 305 may be made of a material having relatively poor thermal conductivity, such as ceramic (e.g., alumina), and can incorporate a heat sink made of a thermally conductive material, such as copper-tungsten. Lid 305 may be made of a single layer of material or of two or more layers attached, e.g., laminated, together. If lid 305 is made of two or more layers, a power plane or planes, a ground plane or planes, and/or traces for signal routing can be formed on the surface of one or more of the layers prior to attachment of the layers so that the planes or traces are within lid 305. Lid 305 has a thickness sufficient to hold the weight of chip 301. In one specific embodiment, lid 305 is square, has a width WL (FIG. 4) of 1.64 inch, is made of alumina, and has a thickness TL of 0.040 inch that is sufficient to carry the weight of a 64 bit microprocessor chip of size 0.425 inch×0.592 inch×0.010 inch, for example a R4400 microprocessor.

Lid 305 is attached to base 302 with adhesive 311. Adhesive 311 seals cavity 302a so that contaminants or moisture cannot enter cavity 302a through the gap between lid 305 and base 302 and contaminate chip 301 or chips 308. Adhesive 311 can be, for example, an epoxy resin. Alternatively, adhesive 311 can be a soft solder (e.g., a lead/tin/silver alloy) or a hard solder (e.g., a tin/gold alloy). Adhesive 311 is heated and then cooled to solidify according to a time/temperature profile as is well-known in the art for the particular material used for adhesive 311.

Base 302 is made of, for instance, alumina. Base 302 can also be made of the same material as a lid, such as aluminum nitride, if more thermal dissipation is needed than possible from an alumina base. Typically, base 302 is a multilayer structure, formed using conventional processes and equipment, interior portions of some of the layers being removed to form cavity 302a and lid mounting surface 302c.

Cavity 302a must be sufficiently large to accommodate a predetermined number of chips. In one specific embodiment, cavity 302a has a square area with a side of 1.480 inch and a height HC (FIG. 4) of 0.067 inch between cavity bottom surface 302b and lid mounting surface 302c. In this embodiment, base 302 has a thickness TP of 0.15 inch between base bottom surface 302e and base top surface 302d.

An integrated circuit chip or chips are attached to both die attach surface 305a of lid 305 and cavity bottom surface 302b of base 302. Attachment of a chip or chips to both lid 305 and base 302 allows more chips to be enclosed with PGA 300 so that the number of electrical functions that can be performed by PGA 300 is increased as compared to a PGA in which chips are attached only to the base of the PGA.

In PGA 300, a single chip 301 is attached to lid 305 and a multiplicity of chips 308 are attached to base 302. However, this need not be the case; a single chip or a multiplicity of chips can be attached to either lid 305 or base 302. Chip 301 can be, for example, a processor chip. Chips 308 can be, for example, memory chips. Generally, the chip or chips that generate the most heat during operation, e.g., processor chips, are attached to lid 305 which can more readily transfer the heat out of PGA 300.

Figure 4:
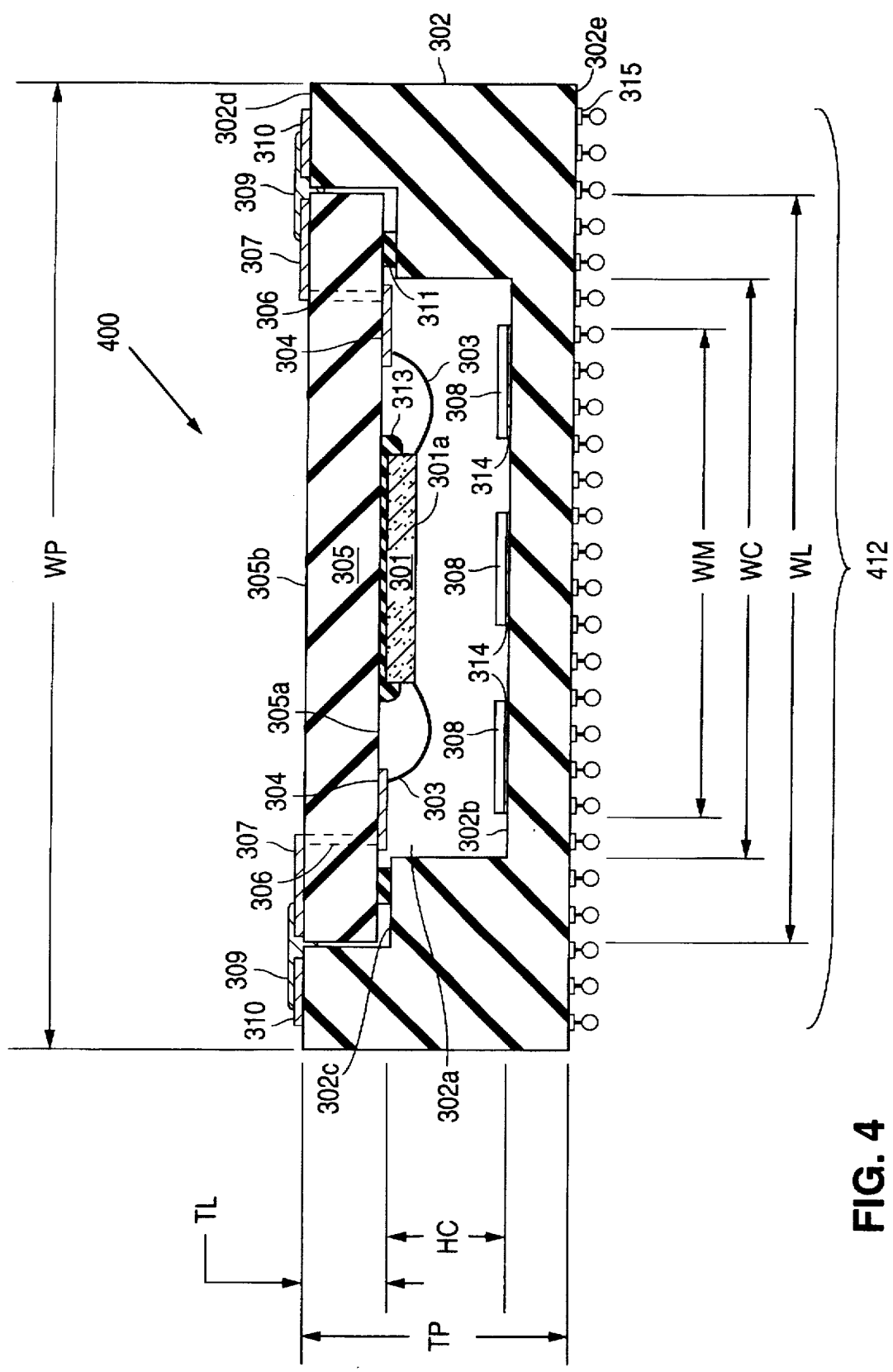
FIG. 4 is a cross-sectional view of a ball grid array according to an embodiment of the invention.

In one specific embodiment, two rows of chips 308 (rather than three as shown in FIG. 4) are attached in a mounting area of cavity bottom surface 302b with width WM of 1.215 inch and length (not shown) of 1.313 inch, so that five chips 308 (not shown) are accommodated in each of two rows. In this specific embodiment, chips 308 are 64K×18 megabit memory chips suitable for use as a cache for processor chip 301.

Chip 301 can be electrically tested and burned in after attachment to lid 305, but before attachment of lid 305 to base 302. If chip 301 proves to be defective, then only chip 301 and lid 305 need be discarded. In prior PGAs in which the chip or chips are all attached to the base, if a chip proves to be defective, the base as well as the chip must be discarded. A base can be more expensive than the lid (on the order of five times more expensive) as a typical base is a complex, custom manufactured multi-layered part with vias, traces and gold plated pin-grid-array (PGA) pins. PGAs according to the invention provide cost savings in the manufacturing process because inexpensive lids rather than expensive bases are discarded if a chip attached to the lid is defective.

Even if a lid is as expensive as a base, the lid and the base can each be individually tested and if necessary corrected, before a known good base and a known good lid are joined to each other.

Additionally, if possible, consistent with other considerations (e.g., the amount of heat generated by each chip to be included in the PGA), it is desirable to attach chips that are expected to have the lowest yields (i.e., the greatest percentage of defective chips) to the lid in order to minimize the expense associated with discarding of defective chips.

Adhesive 313 is used to attach chip 301 to die attach surface 305a of lid 305. Adhesive 313 can be thermally conductive and either electrically conductive or electrically non-conductive. A low melting temperature glass (e.g., JMI silver glass) including silver flakes can be used as an electrically conductive adhesive. Epoxy resin can be used as an electrically non-conductive adhesive. Electrically conductive or not, preferably, adhesive 313 is made of a thermally conductive material so that heat can be readily transferred from chip 301 to lid 305. The heat is then transferred through thermally conductive lid 305 to exterior surface 305b and from there away from PGA 300.

In FIG. 3A, the bond pads on chip 301 are attached with bond wires 303 to traces 304 on die attach surface 305a of lid 305 using conventional wirebonding processes, equipment and materials. For example, aluminum wire bonding, gold ball bonding or reverse gold ball bonding can be used. Likewise, though not shown in FIG. 3A for simplicity, chips 308 can be wirebonded to traces formed on cavity bottom surface 302b of base 302. Alternatively, chips 301 or 308 can be electrically connected to electrically conductive material on die attach surface 305a of lid 305 or cavity bottom surface 302b of base 302, respectively, using other techniques such as flip chip interconnection.

Electrical signals from chip 301 travel through bond wires 303, traces 304 and vias 306 to traces 307 formed on exterior surface 305b of lid 305. Electrically conductive material 309, e.g., solder, is used to electrically connect traces 307 on exterior surface 305b of lid 305 to electrically conductive traces 310 formed on base top surface 302d, as is described in more detail below. Traces 310 are electrically connected to lands 315 formed on base bottom surface 302e through electrically conductive vias and traces (not shown) formed in base 302. A portion of a trace 310 is formed on surface 302d and the rest of trace 310 passes through base 302 and is connected either to chips 308 mounted on base 302 or to one of pins 312. The vias and traces in base 302 are formed using conventional equipment and processes as part of formation of multilayer base 302. For example, a trace 310 can be formed of tungsten inside base 302 and coated with nickel and gold on the portion of trace 310 formed on base top surface 302d. Likewise bond pads on chips 308 are attached to electrically conductive material on cavity bottom surface 302b of base 302 which is, in turn, electrically connected to lands 315 by vias and traces formed in base 302. Additionally, some of traces 310 are connected to the electrically conductive material on cavity bottom surface 302b so that electrical connection is made between chip 301 and one or more of chips 308.

Electrically, one of conductive pins 312 is attached to each of lands 315 as is well known in the art, e.g., by brazing with a high temperature solder. Pins 312 are then inserted into corresponding holes in a mounting board to complete the electrical connection of the circuitry on chips 301 and 308 to electronics external to PGA 300.

Figure 1A:
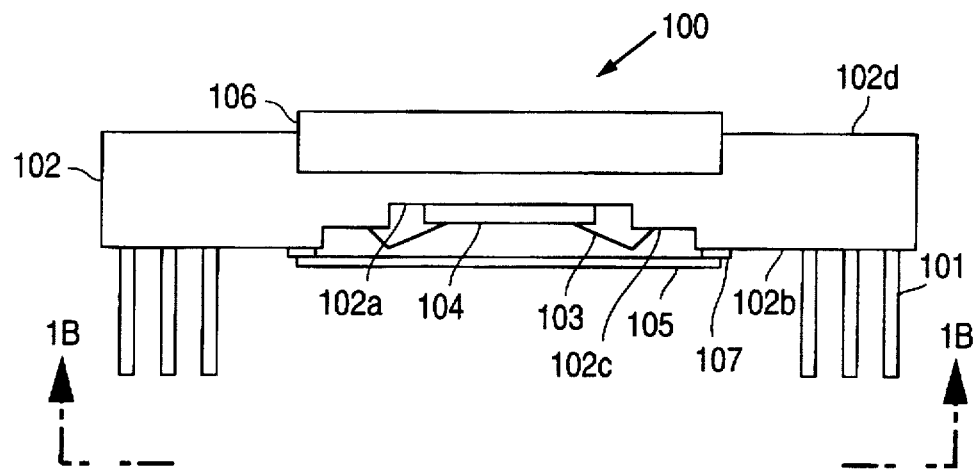
FIG. 1A is a cross-sectional view of a prior art cavity-down ceramic pin grid array.
Figure 1B:
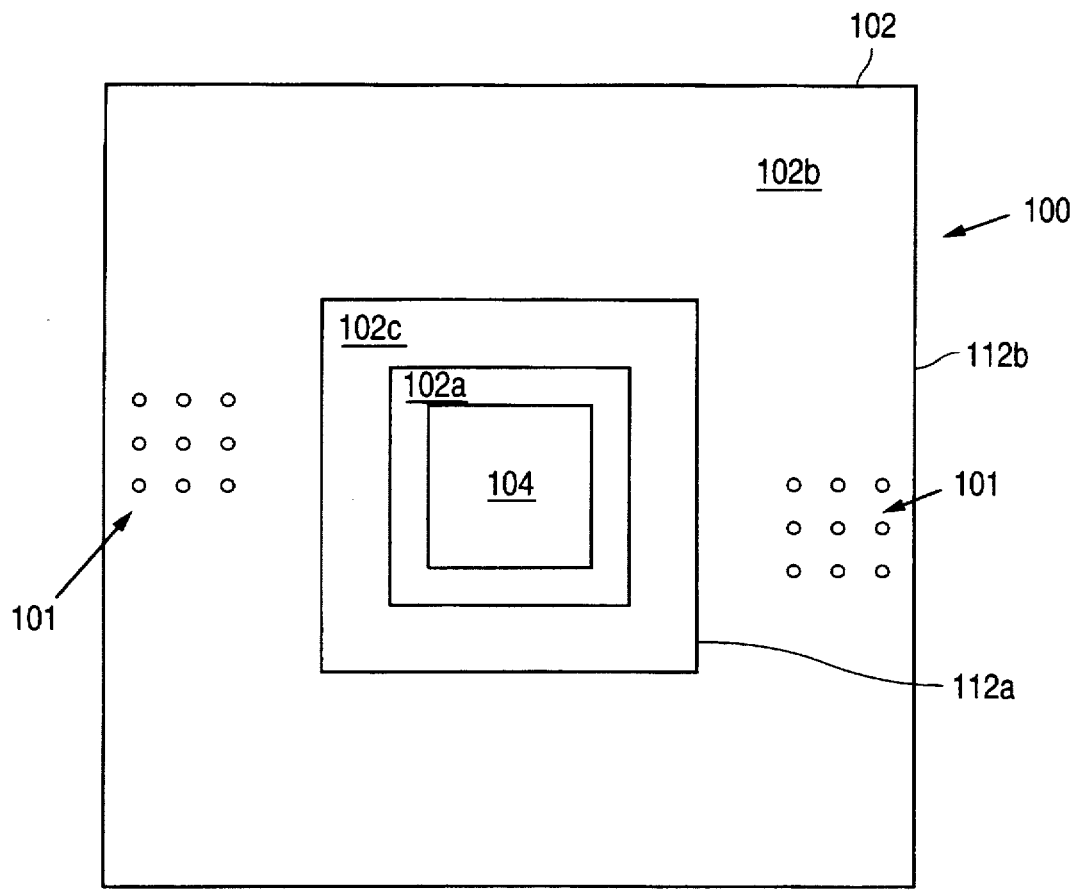
FIG. 1B is a bottom plan view of the cavity-down ceramic pin grid array of FIG. 1A with the lid removed.
Figure 2:
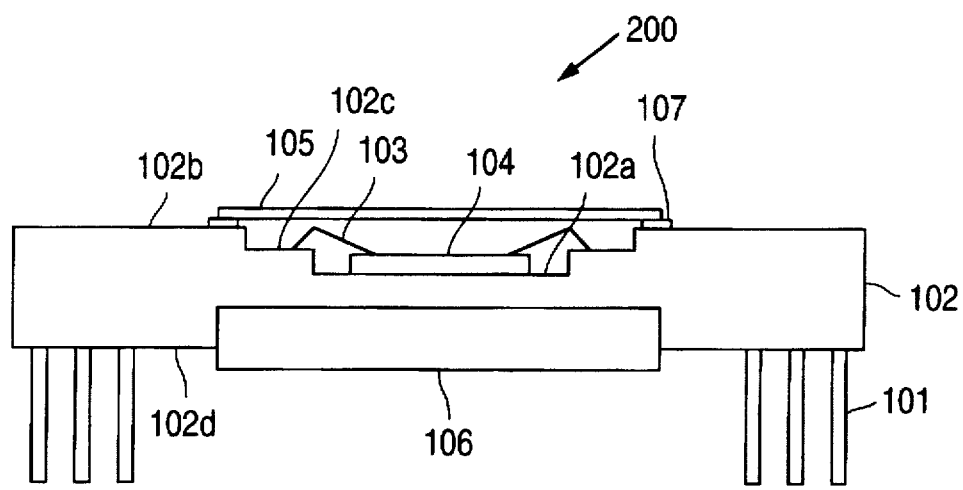
FIG. 2 is a cross-sectional view of a prior art cavity-up ceramic pin grid array.
Figure 3B:
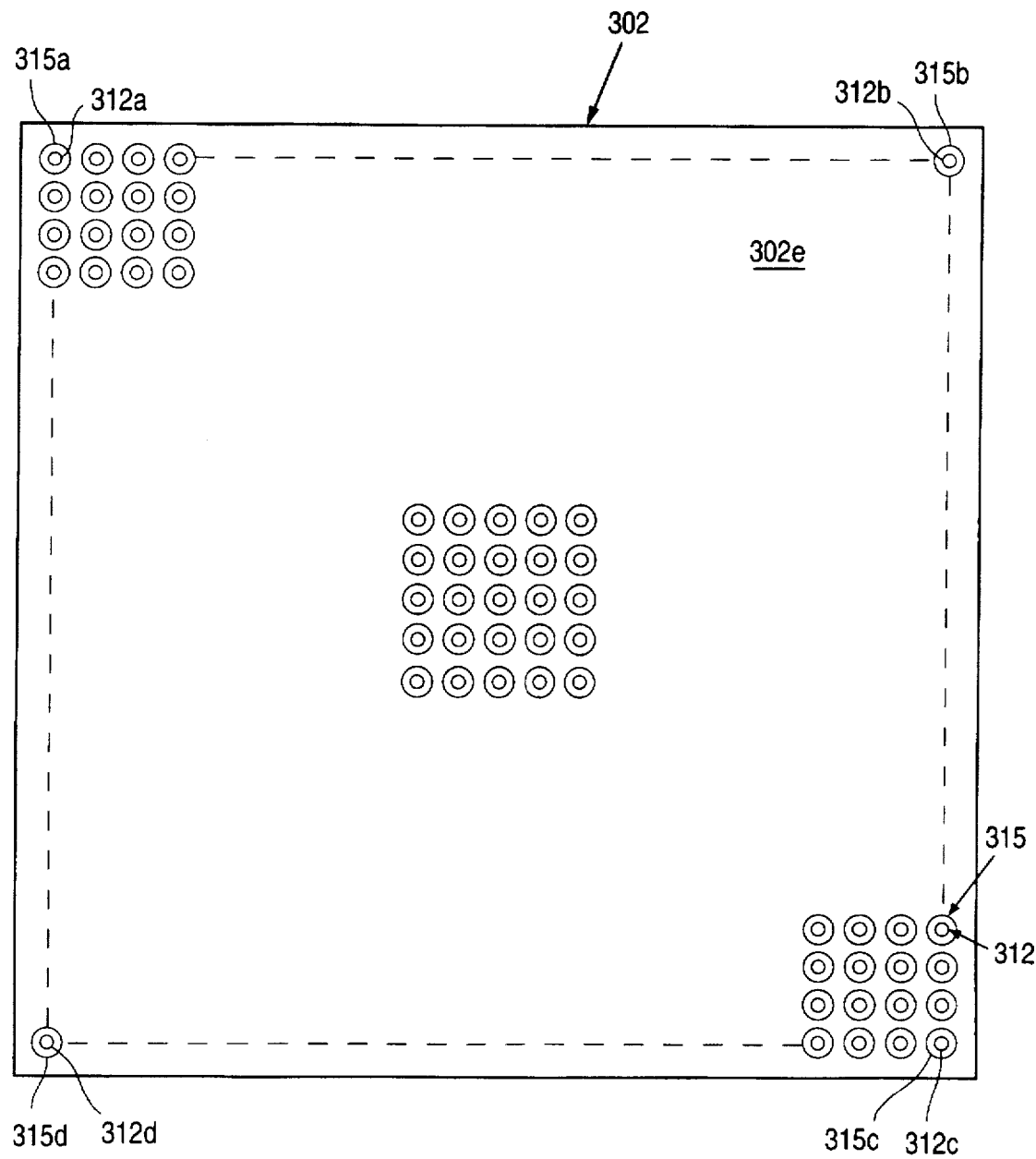
FIG. 3B is a bottom plan view of portions of the pin grid array of FIG. 3A.

FIG. 3B is a bottom plan view of pin grid array 300 illustrating pins 312 extending from lands 315 on base bottom surface 302e. Only some of pins 312 and lands 315 are shown; the remainder are removed for simplicity. However, it is to be understood that pins 312 and lands 315 cover all of base bottom surface 302e within the rectangular area defined by pins 312a, 312b, 312c and 312d (or lands 315a, 315b, 315c and 315d). Comparing PGA 300 according to the invention (FIG. 3B) to prior art PGA 100 (FIG. 1B), it is seen that, when PGAs 100 and 300 have the same footprint size, i.e., surfaces 102b and 302e have the same area, more pins 312 are formed on PGA 300 than pins 101 on PGA 100. Thus, as compared to prior art PGAs, PGAs according to the invention enable either more electrical signals to be transmitted from PGAs of the same size, or a smaller PGA to be used to transmit the same number of electrical signals.

FIG. 4 is a cross-sectional view of ball grid array (BGA) 400 according to another embodiment of the invention. The structure of ball grid array 400 is similar to that of PGA 300 and the same elements are numbered with the same numerals in FIGS. 3A and 4. In ball grid array 400, rather than attaching one of pins 312 to each of lands 315, one of solder balls 412 is formed on each of lands 315. Though shown as circular in FIG. 4, solder balls 412 can be of any shape. BGA 400 is then placed on a mounting board so that each of solder balls 412 contact electrically conductive material on the mounting board. Solder balls 412 are then reflowed, as is well known in the art, to electrically connect BGA 400 to the mounting board.

Figure 5C:
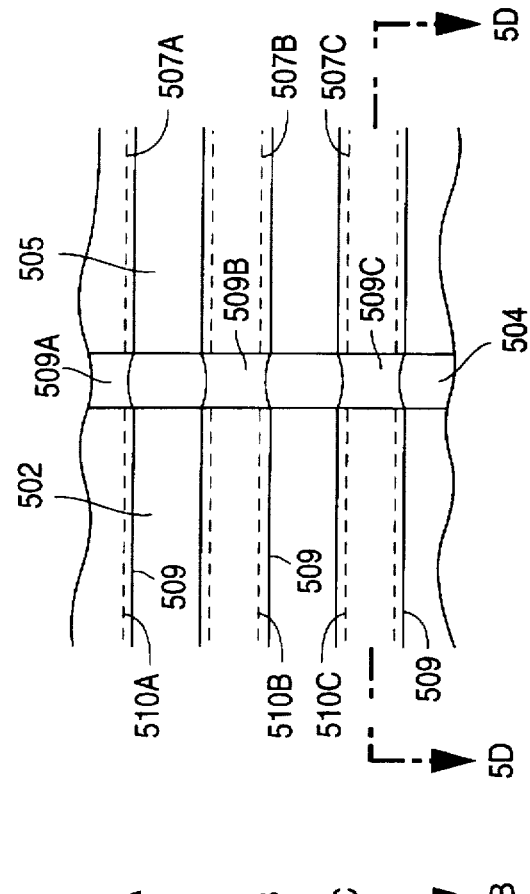
FIG. 5C is a plan view of the portion of the base and lid of FIG. 5A illustrating the formation of electrically conductive bridges between electrically conductive traces formed in or on the lid and electrically conductive traces formed in or on the base according to an embodiment of the invention.
Figure 5D:
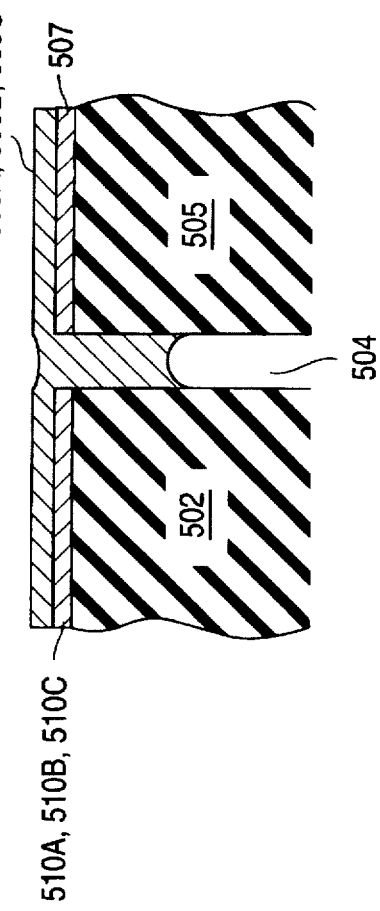
FIG. 5D is a cross-sectional view taken along section 5D—5D of FIG. 5C.
Figure 5A:
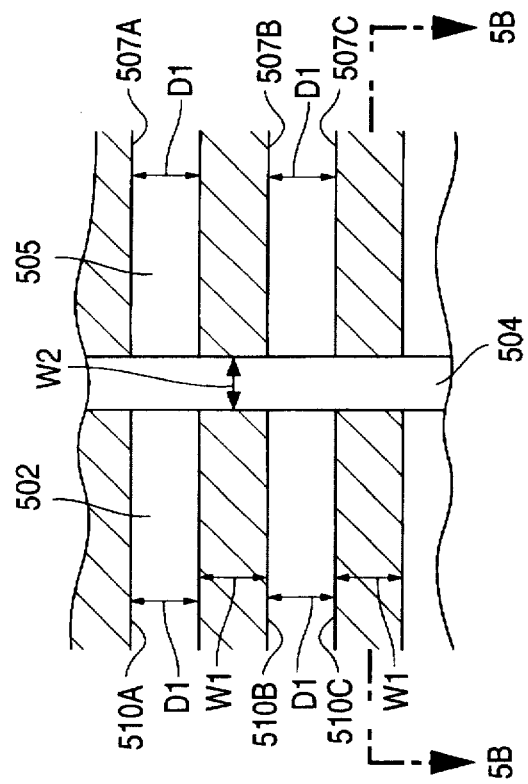
FIG. 5A is a plan view of a portion of a base and a lid for use in packaging one or more semiconductor die, illustrating the interface between the base and the lid.
Figure 5B:
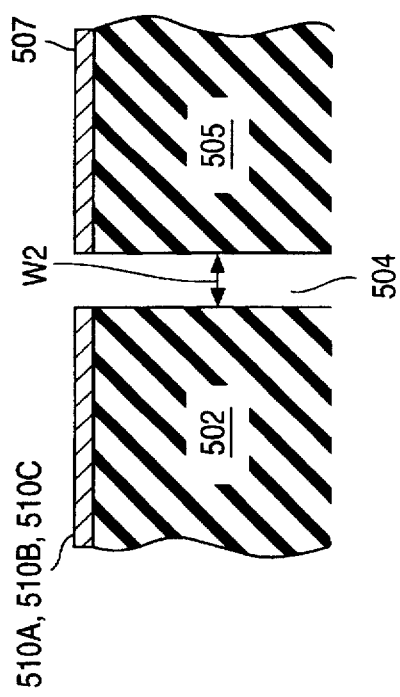
FIG. 5B is a cross-sectional view taken along section 5B—5B of FIG. 5A.

FIG. 5A is a plan view of a portion of base 502 and lid 505 for use in packaging one or more semiconductor die according to the invention, illustrating the interface between base 502 and lid 505. FIG. 5B is a cross-sectional view taken along section 5B—5B of FIG. 5A. Traces 507A, 507B and 507C are formed on lid 505 and traces 510A, 510B and 510C are formed on base 502. Although three traces are illustrated in FIGS. 5A and 5C on base 502 and lid 505, any number of traces can be used in accordance with this invention. Each of traces 507A, 507B, 507C, 510A, 510B and 510C extend to the edge of lid 505 or base 502, respectively.

When lid 505 is attached to base 502, gap 504 exists between lid 505 and base 502. Gap 504 has a width 503. Lid 505 is attached to base 502 so that each trace 507A, 507B and 507C lies opposite a corresponding one of traces 510A, 510B and 510C across gap 504. Adjacent traces (510A, 510B) and (510B, 510C) on base 502 and adjacent traces (507A, 507B) and (507B, 507C) on lid 505 are separated by a distance D1.

FIG. 5C is a plan view of the portion of base 502 and lid 505 illustrating the formation of electrically conductive bridges 509A, 509B and 509C between electrically conductive traces 507A, 507B and 507C formed in or on lid 505 and corresponding electrically conductive traces 510A, 510B and 510C formed in or on base 502. FIG. 5D is a cross-sectional view taken along section 5D—5D of FIG. 5C.

Electrically conductive bridges 509A, 509B and 509C can be formed by any conventional technique, such as screen printing across corresponding traces (507A, 510A), and (507B, 510B) and (507C, 510C) with solder or conductive epoxy and reflowing. Electrically conductive bridges 509A, 509B and 509C are formed in one embodiment of this invention by dipping only the top surface of the package, including lid 505 and base 502, into a solder bath. Illustratively, the solder can be a composition of lead and tin. The solder only wets to the metal of traces 507A, 507B, 507C, 510A, 510B and 510C and not to the ceramic material of base 502 and lid 505. Some solder flows into gap 504 between lid 505 and base 502. Surface tension of the solder causes the solder to span gap 504 before filling in all of gap 504 between the corresponding traces as shown in FIGS. 5C and 5D. Therefore, bridging by solder dipping, which is considered to be undesirable in some situations, is used to form electrically conductive bridges 509A, 509B and 509C in accordance with this invention. In one embodiment, the width W of gap 504 must be less than the width of a trace 510.

Surface tension could also result in the solder spanning distance D1 between adjacent traces (507A, 507B), or (507B, 507C) or (510A, 510B) or (510B, 510C) which is undesirable. Consequently, distance D1 between adjacent traces (507A, 507B), or (507B, 507C) or (510A, 510B) or (510B, 510C) is chosen to be larger than width W of gap 504. Distance D1 is sufficiently large relative to width W (20% in one embodiment) so that the solder spans gap 504 without spanning distance D1 between traces 510 or traces 507, i.e., the solder makes electrical connection between corresponding traces (507A, 510A), and (507B, 510B) and (507C, 510C) across gap 504 before the solder electrically shorts together any of adjacent traces (507A, 507B), or (507B, 507C) or (510A, 510B) or (510B, 510C). Distance D1 can be any distance larger than the distance necessary for the ceramic to dewet and thus avoid shorting adjacent traces.

In one specific embodiment, each of traces 507A, 507B, 507C, 510A, 510B and 510C has a width W1 of 15 mils, gap 504 has a width W2 of 15 mils and distance D1 is 20 mils or less, for using a 63/37 Sn/Pb solder wave at approximately 230° C., and generally between 225° C. and 235° C. However the exact dimensions and the relationship between trace width W1, distance D1 and gap width W2 is a function of the surface tension of the particular type of solder used to form bridges 509A, 509B and 509C, the temperature to which the solder is heated and the rate of extraction of lid 505 and base 502 from the solder bath.

In another embodiment, trace width W1 is 40 mils and the maximum width W2 of gap 504 is less than or equal to 40 mils. The width W2 of gap 504 is less than trace width 501B in one embodiment.

In an alternative embodiment, the solder is made of 95/5 Sn/Pb, the solder bath is held at a temperature of 275°–300° C., and base top surface 302d (FIG. 3A) and lid exterior surface 305b are immersed in the solder bath to form the solder bridges between corresponding traces.

FIG. 6A is a plan view of a portion of base 602 and lid 605 for use in packaging one or more semiconductor die, illustrating the interface between base 602 and lid 605 according to another embodiment of the invention. FIG. 6B is a cross-sectional view taken along section 6B—6B of FIG. 6A. In FIGS. 6A and 6B, traces 607A, 607B and 607C as well as traces 610A, 610B and 610C extend beyond the edge of lid 605 and base 602, respectively, and down into gap 604 between lid 605 and base 602. It is sufficient for traces 607A, 607B, 607C and traces 610A, 610B, 610C to extend into gap 604 by a small distance 1, for example a few mils, to ensure that the strength of the bridge formed by the solder is at least equal to the strength of a trace, such as trace 607. Distance W4 separates corresponding traces (607A, 610A) and (607B, 610B) and (607C, 610C) within gap 604.

FIG. 6C is a plan view of the portion of base 602 and lid 605 illustrating the formation of electrically conductive bridges 609A, 609B and 609C between electrically conductive traces 607A, 607B and 607C formed in or on lid 605 and corresponding electrically conductive traces 610A, 610B and 610C formed in or on base 602. FIG. 6D is a cross-sectional view taken along section 6D—6D of FIG. 6C.

As before, electrically conductive bridges 609A, 609B and 609C are formed by dipping the top surface of the package, including lid 605 and base 602 into a solder bath. However, since traces 607A, 607B, 607C, 610A, 610B and 610C extend into gap 604, width 603A that the solder must span to make electrical connection between corresponding traces (607A, 610A) and (607B, 610B) and (607C, 610C) is reduced as compared to width 504 between corresponding traces (507A, 510A) and (507B, 510B) and (507C, 510C) in FIGS. 5A through 5D. Consequently, trace width W3 and distance D2 between adjacent traces (610A, 610B) and (610B, 610C) and (607A, 607B) and (607B, 607C) can be reduced, as compared to trace width W1 and distance D1 in FIGS. 5A through 5D. As adjacent traces (607A, 607B) and (607B, 607C) and (610A, 610B) and (610B, 610C) can be placed closer together, an increased density of traces can be realized with a PGA having a lid 605 and base 602 as illustrated in FIGS. 6A through 6D.

Figure 7:
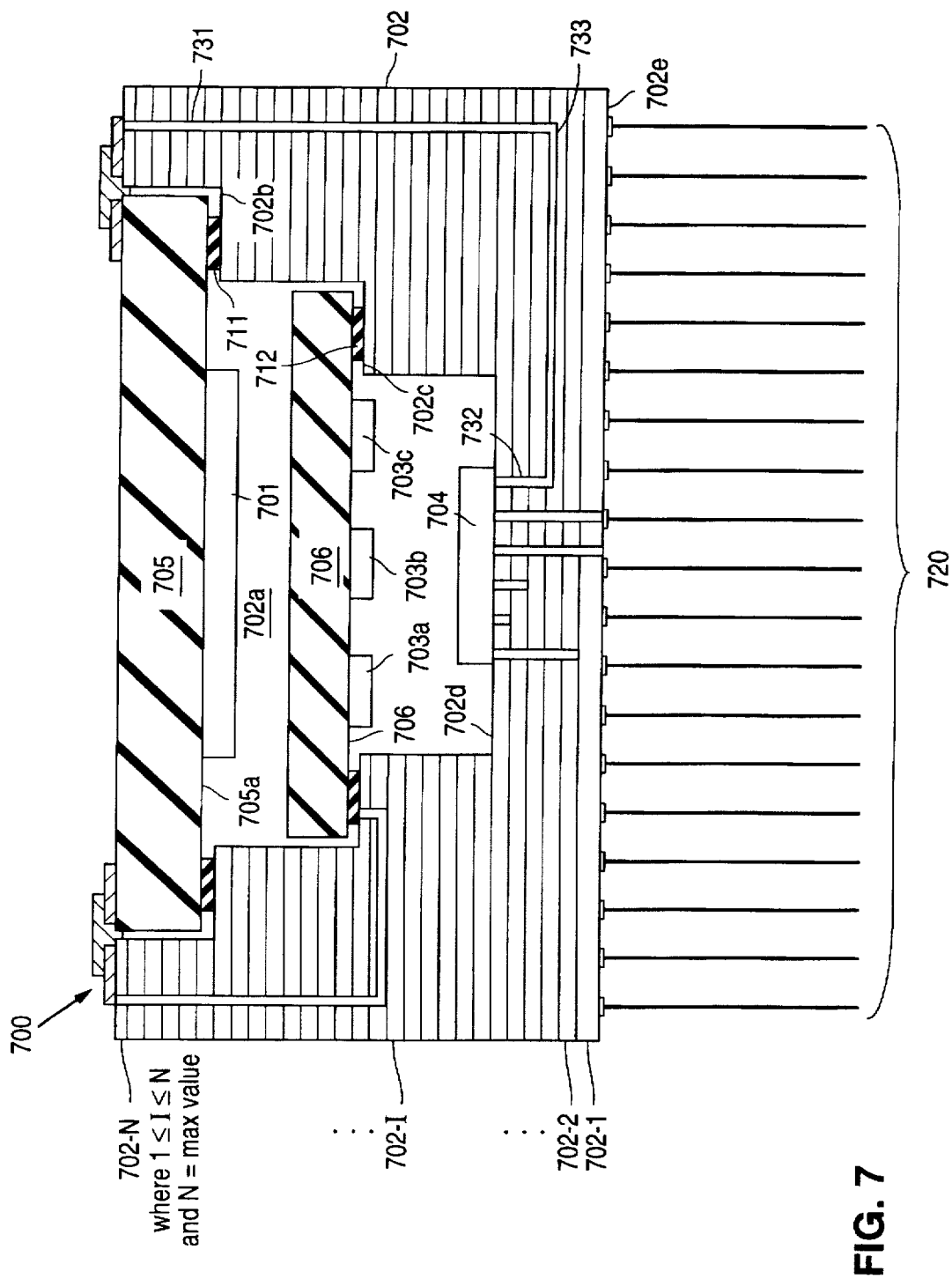
FIG. 7 is a cross-sectional view of a PGA according to another embodiment of the invention.

FIG. 7 is a cross-sectional view of PGA 700 according to another embodiment of the invention. Lid 705 is attached with adhesive 711 to lid attach surface 702d of base 702 to enclose cavity 702a formed in base 702. Integrated circuit chip 701 is attached to die attach surface 705a of lid 705 so that chip 701 is enclosed within cavity 702a. Substrate 706, preferably of material similar to lid material such as alumina, is attached with adhesive 712 to shelf 702c of base 702 and is also enclosed with cavity 702a. A plurality of integrated circuit chips 703a, 703b and 703c are attached, to substrate 706. Integrated circuit chip 704 is attached to cavity bottom surface 702b of base 702 and is also enclosed within cavity 702a. Each of chips 701, 703a, 703b, 703c and 704 are mechanically attached to lid 705, substrate 706 and base 702, respectively, with adhesives in the same manner as described above with respect chips 301 and 308 (FIG. 3A). Adhesive 711 and 712 made of the same materials as described above with respect to adhesive 311 (FIG. 3A).

Each of a plurality of pins 720 extend from a corresponding land 715 formed on base exterior surface 702e to provide electrical connection of PGA 700 to a mounting board. It is to be understood that, alternatively, a solder ball could be formed on each land 715, in the manner described above with respect to FIG. 4, to make electrical connection to a mounting board (in this case, the packaged integrated circuit would be denominated a ball grid array).

Each of chips 701, 703a, 703b, 703c and 704 are electrically connected to electrically conductive material (not shown) formed on die attach surface 705a of lid 705, surface 706a of substrate 706 and cavity bottom surface 702b of base 702 by, for instance, wirebonding or flip chip connection. In FIG. 7, base 702 is a multi-layered structure having several layers, such as layers 702-1, 702-2, 702-I . . . 702-N that may be formed in the conventional manner. The electrically conductive material, e.g., traces, on die attach surface 705a of lid 705 is electrically connected by vias, such as vertical via 733, and traces, such as horizontal trace 733 (not all vias and traces are shown in FIG. 7), to the electrically conductive material on surfaces 706a and 702d, in the same manner as described above with respect to FIG. 3A. Likewise, the electrically conductive material formed on cavity bottom surface 702b is connected by vias and/or traces to some of pins 720 as described above with respect to FIG. 3A.

Although lid 705 must be sealed, substrate 706 does not need be sealed. Traces on substrate 706 are electrically connected to traces on base 702 in a region adjacent to adhesive 712 by various means such as soldering. Some of the traces on base 702 feed through layers in base 712 and are electrically connected to pins 720.

Generally, any type or number of chips can be attached to lid 705, substrate 706 or base 702. However, preferably, the chip or chips that generate the most heat are attached to lid 705, since lid 705 is made of a material with good thermal conductivity, e.g., aluminum nitride, that readily transfers heat from the chip to the exterior of PGA 700. The chip or chips that generate the next greatest amount of heat are preferably attached to base 702, since heat from those chips must only be transferred through the distance between cavity bottom surface 702b and base exterior surface 702e in order to leave PGA 700. The chip or chips that are coolest during operation of PGA 700 are preferably attached to substrate 706, since heat from those chips must travel through substrate 706, through adhesive 712 and through the distance between shelf 702c and base exterior surface 702e in order to leave PGA 700.

In further embodiments of the invention, base 702 can be formed with additional shelves similar to shelf 702c so that additional substrates containing integrated circuit chips can be attached within cavity 702a. Preferably, the chips that are coolest during operation of the packaged integrated circuit are mounted on the additional substrates.

Substrate 706 (and any other substrate or substrates that may be present in an embodiment of the invention) is formed of conventional materials such as alumina or ceramic according to conventional processes using conventional equipment, as is well known in the art. Substrate 706 can include a single layer or multiple layers and can have a power plane or planes, ground plane or planes, and signal routing traces formed on the surface of one or more layers. Likewise, lid 705 can have one or more layers and include power planes, ground planes and signal routing traces.

As described above, it is possible to electrically test and burn in chip 701 attached to lid 705 before committing lid 705 to PGA 700. Likewise, chips 703 attached to substrate 706 can be electrically tested and burned in before committing substrate 706 to PGA 700. This pre-testing minimizes the cost associated with discarding of defective chips, as described in more detail above.

Figure 8:
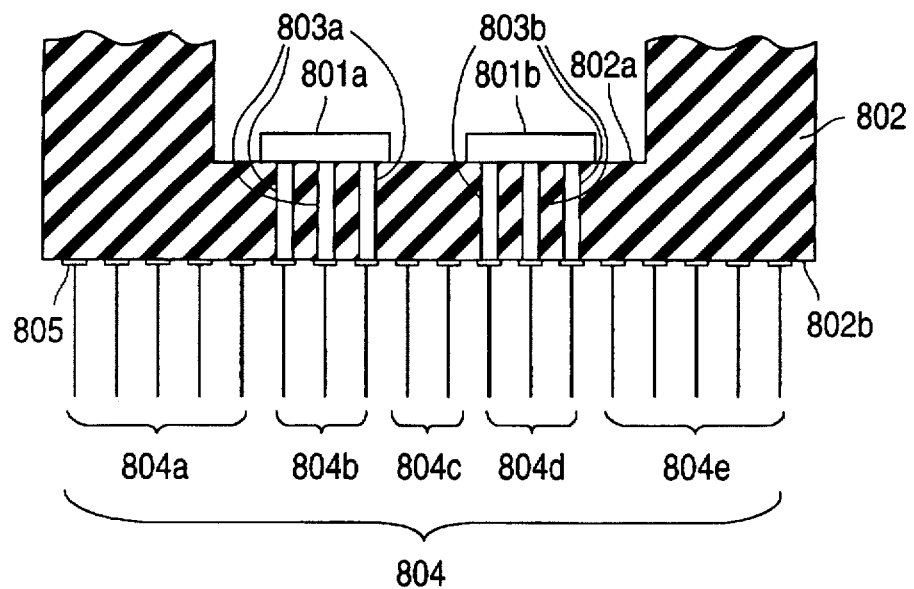
FIG. 8 is a cross-sectional view of a portion of a base for use with a PGA according to any of the above-described embodiments of the invention.

FIG. 8 is a cross-sectional view of a portion of base 802 for use with a PGA according to any of the above-described embodiments of the invention. Integrated circuit chips 801a and 801b are mounted on cavity bottom surface 802a of base 802. Each of a plurality of pins 804 are formed on a corresponding one of lands 805 formed on base exterior surface 802b. some pins, such as pins 804a, 804c and 804e are used to transmit electrical signals from chips within the PGA to circuitry on a mounting board as described above.

Other pins, such as pins 804b and 804d are connected to heat conducting vias 803a and 803b formed through base 802 and extending from chips 801a and 801b to lands 805. Heat conducting vias 803a and 803b are formed of a material having good thermal conductivity such as tungsten. In this embodiment, heat conducting pins 804b and 804d only conduct heat from the PGA and do not transmit electrical signals. The use of heat conducting vias 803a, 803b and heat conducting pins 804b, 804d improves the heat transfer from chips 801a, 801b.

Various embodiments of the invention have been described. The descriptions are intended to be illustrative, not limitative. Thus, it will be apparent to one skilled in the art that several modifications can be made to the embodiment as described without departing from the scope of the claims set out below. For instance, though ceramic is used as the material for the base and/or substrate and/or lid in the above-described embodiments of the invention, other materials can be used, such as conventional printed circuit board materials. Moreover, although specific solder bath and temperature have been described above, other methods can be used to form electrically conductive bridges between traces on a lid or a substrate and corresponding traces on a base. Additionally, though embodiments of the invention described with respect to PGAs and BGAs, the invention is equally applicable to surface mount packaged integrated circuits in which leads extend from the package and are attached to a mounting board.

We claim:

1. A method for forming a packaged integrated circuit module, comprising the steps of:
    attaching a first semiconductor die to a die attach surface within a cavity of a base;
    electrically connecting circuitry formed on the first semiconductor die to conductive material on the die attach surface of the base;
    attaching a second semiconductor die to a die attach surface of a lid;
    electrically connecting the circuitry formed on the second semiconductor die to conductive material on the die attach surface of the lid;
    electrically connecting the conductive material on the die attach surface of the base to contact pads formed on a module contact surface of the base that is opposite the lid, or to traces formed on an exterior surface of the base;
    electrically connecting the conductive material on the die attach surface of the lid to traces formed on an exterior surface of the lid;
    mounting the lid on a ledge of the base such that the exterior surface of the lid is adjacent to the exterior surface of the base, and the first semiconductor die and the second semiconductor die are enclosed within a cavity between the lid and the base; and
    electrically connecting traces on the exterior surface of the lid to traces on the exterior surface of the base thereby to electrically couple circuitry formed on the second semiconductor die to contact pads formed on the module contact surface of the base or to circuitry formed on the first semiconductor die.

2. A method as in claim 1, wherein electrically conductive pins extend from each contact pad.

3. A method as in claim 1, wherein electrically conductive balls are formed on each contact pad.

4. The method of claim 1 wherein the step of electrically connecting traces comprises:
    immersing the base exterior surface and the lid exterior surface in a solder bath; and
    using surface tension of solder in said solder bath to span a gap between traces on the base exterior surface and traces on the lid exterior surface, thereby to form solder bridges while withdrawing the base exterior surface and the lid exterior surface from the solder bath.

5. A method for making an electrical connection between a first trace formed at a surface of a first substrate, said first trace being proximate to an edge of the first substrate, and a second trace formed at a surface of a second substrate, said second trace being proximate to an edge of the second substrate, the method comprising the steps of:
    immersing the surface of the first substrate and the surface of the second substrate in a solder bath;
    holding the first substrate and the second substrate together but separated by a gap such that the first trace and the second trace are proximate to each other; and
    using surface tension of solder in said solder bath to span the gap between the first trace and the second trace, thereby to form a solder bridge while withdrawing the surface of the first substrate and the surface of the second substrate from the solder bath, the solder bridge providing an electrical connection between the first trace and the second trace.

6. A method as in claim 5, further comprising:
    forming a plurality of first traces separated from each other by a distance larger than a width of said gap, each first trace being formed on the surface of the first substrate proximate to the edge of the first substrate, each first trace extending into said gap; and
    forming a plurality of second traces separated from each other by a distance larger than said width, each second trace being formed on the surface of the second substrate proximate to the edge of the second substrate, each second trace being aligned with one of the first traces, each second trace extending into the gap; and
    immersing said surface of the first substrate and said surface of the second substrate in the solder bath such that a solder bridge is formed between each first trace and second trace aligned with the first trace but solder does not form contact between a pair of adjacent first traces or a pair of adjacent second traces.

7. A method as in claim 6, wherein:
    the solder includes a material selected from the group consisting of Sn and Pb.

8. A method as in claim 7, wherein:
    the solder bath is held at a temperature between 225° C. and 235° C.

9. A method as in claim 7, wherein:
    the solder bath is held at a temperature between 275° C. and 300° C.

10. A method for forming a packaged integrated circuit module, comprising the steps of:
    attaching a first semiconductor die to a die attach surface within a cavity of a base;
    electrically connecting circuitry formed on the first semiconductor die to conductive material on the die attach surface of the base;
    attaching a second semiconductor die to a die attach surface of a lid;

electrically connecting the circuitry formed on the second semiconductor die to conductive material on the die attach surface of the lid;

electrically connecting the conductive material on the die attach surface of the base to contact pads formed on a module contact surface of the base that is opposite the lid, or to traces formed on an exterior surface of the base; and electrically connecting the conductive material on the die attach surface of the lid to traces formed on an exterior surface of the lid.

11. A method as in claim 10, further comprising:

electrically connecting traces on the exterior surface of the lid to traces on the exterior surface of the base thereby to electrically couple circuitry formed on the second semiconductor die to contact pads formed on the module contact surface of the base or to circuitry formed on the first semiconductor die.

12. A method as in claim 10, further comprising:

mounting the lid on a ledge of the base such that the exterior surface of the lid is adjacent to the exterior surface of the base, and the first semiconductor die and the second semiconductor die are enclosed within a cavity between the lid and the base.

13. A method as in claim 10, wherein electrically conductive pins extend from each contact pad.

14. A method as in claim 10, wherein electrically conductive balls are formed on each contact pad.

* * * * *